United States Patent
Kashiwabara

(10) Patent No.: US 9,147,714 B2
(45) Date of Patent: Sep. 29, 2015

(54) ORGANIC ELECTROLUMINESCENCE DEVICE

(71) Applicant: SAMSUNG DISPLAY CO., LTD., Yongin, Gyeonggi-Do (KR)

(72) Inventor: Mitsuhiro Kashiwabara, Yokohama (JP)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/092,327

(22) Filed: Nov. 27, 2013

(65) Prior Publication Data

US 2014/0151663 A1 Jun. 5, 2014

(30) Foreign Application Priority Data

Nov. 30, 2012 (JP) ................................. 2012-263666

(51) Int. Cl.
| | |
|---|---|
| *H01L 29/08* | (2006.01) |
| *H01L 35/24* | (2006.01) |
| *H01L 51/00* | (2006.01) |
| *H01L 27/32* | (2006.01) |
| *H01L 51/52* | (2006.01) |

(52) U.S. Cl.
CPC ........ *H01L 27/3211* (2013.01); *H01L 51/5203* (2013.01); *H01L 51/5265* (2013.01); *H01L 51/5271* (2013.01)

(58) Field of Classification Search
CPC ................... H01L 51/5271; H01L 2251/5315; H01L 51/5218; H01L 27/3211; H01L 33/20; H01L 33/405; H01L 33/60; C03C 17/3655; C03C 17/3668; G02F 1/133553
USPC ......... 257/40, 98, E33.001, E51.022, 765, 89
See application file for complete search history.

(56) References Cited

U.S. PATENT DOCUMENTS

| | | | | |
|---|---|---|---|---|
| 7,470,933 | B2 * | 12/2008 | Lee et al. ......................... | 257/79 |
| 2004/0217694 | A1 * | 11/2004 | Cok et al. ...................... | 313/504 |
| 2005/0280355 | A1 * | 12/2005 | Lee et al. ...................... | 313/503 |
| 2006/0105201 | A1 * | 5/2006 | Lee et al. ...................... | 428/690 |
| 2007/0075310 | A1 * | 4/2007 | Lee ................... | 257/40 |
| 2007/0296334 | A1 * | 12/2007 | Matsuda ....................... | 313/506 |
| 2008/0292994 | A1 * | 11/2008 | Hanawa ....................... | 430/321 |
| 2009/0263924 | A1 * | 10/2009 | Lee ................................ | 438/35 |
| 2009/0325451 | A1 * | 12/2009 | Higo et al. ...................... | 445/24 |

(Continued)

FOREIGN PATENT DOCUMENTS

| | | |
|---|---|---|
| JP | 06-027853 | 2/1994 |
| JP | 07-240277 | 9/1995 |

(Continued)

*Primary Examiner* — Telly Green
(74) *Attorney, Agent, or Firm* — Lee & Morse, P.C.

(57) ABSTRACT

An organic EL device having a red light emitting area and a green light emitting area is provided. Each of the red light emitting area and the green light emitting area has a structure such that a first electrode having a light transmitting characteristic and an organic layer formed on the first electrode are stacked, and a second electrode having a light reflecting characteristic is disposed on the organic layers of the red and green light emitting areas. Reflectance of green light by the second electrode in the red light emitting area is smaller than reflectance of green light in the second electrode of the green light emitting area. Reflectance of red light by the second electrode of the red light emitting area is larger than reflectance of red light by the second electrode of the green light emitting area.

9 Claims, 2 Drawing Sheets

(56) References Cited

U.S. PATENT DOCUMENTS

| | | | |
|---|---|---|---|
| 2011/0085325 A1* | 4/2011 | Lecloux et al. | 362/231 |
| 2011/0204335 A1* | 8/2011 | Dobbs et al. | 257/40 |
| 2011/0204336 A1* | 8/2011 | Dobbs et al. | 257/40 |
| 2011/0204338 A1* | 8/2011 | Dobbs et al. | 257/40 |
| 2011/0204340 A1* | 8/2011 | Dobbs et al. | 257/40 |
| 2011/0206868 A1* | 8/2011 | Higo et al. | 427/595 |
| 2011/0241000 A1* | 10/2011 | Choi et al. | 257/59 |
| 2012/0073735 A1* | 3/2012 | Matsuo | 156/234 |
| 2012/0235178 A1* | 9/2012 | Mori | 257/88 |
| 2012/0298968 A1* | 11/2012 | Kim et al. | 257/40 |
| 2013/0075768 A1* | 3/2013 | Kim et al. | 257/88 |
| 2013/0105778 A1* | 5/2013 | Kim et al. | 257/40 |
| 2013/0161590 A1* | 6/2013 | Yun et al. | 257/40 |
| 2013/0168652 A1* | 7/2013 | Nam et al. | 257/40 |
| 2013/0168653 A1* | 7/2013 | Nam et al. | 257/40 |
| 2013/0187132 A1* | 7/2013 | Ando et al. | 257/40 |
| 2013/0200780 A1* | 8/2013 | Lee | 313/504 |
| 2013/0202812 A1* | 8/2013 | Higo et al. | 427/554 |
| 2013/0207084 A1* | 8/2013 | Im et al. | 257/40 |
| 2014/0231753 A1* | 8/2014 | Chen et al. | 257/40 |
| 2014/0235004 A1* | 8/2014 | Cho | 438/35 |
| 2014/0291627 A1* | 10/2014 | Kim et al. | 257/40 |

FOREIGN PATENT DOCUMENTS

| | | |
|---|---|---|
| JP | 2004-111398 | 4/2004 |
| JP | 2004-235152 | 8/2004 |
| JP | 2006-005328 | 1/2006 |
| JP | 2006-005328 A | 1/2006 |
| JP | 2006-202685 | 8/2006 |
| JP | 2007-273231 | 10/2007 |
| JP | 2009-064703 | 3/2009 |
| JP | 2010-157389 | 7/2010 |
| JP | 2011-146377 | 7/2011 |
| WO | WO-00/60905 | 10/2000 |

* cited by examiner

ORGANIC ELECTROLUMINESCENCE DEVICE

CROSS-REFERENCE TO RELATED APPLICATION

Japanese Patent Application No. 2012-263666, filed on Nov. 30, 2012, in the Japanese Intellectual Property Office, and entitled: "ORGANIC ELECTROLUMINESCENCE DEVICE," is incorporated by reference herein in its entirety.

BACKGROUND

1. Field

Embodiments relate to an organic electroluminescence (hereinafter, referred to as EL) device.

2. Description of the Related Art

An organic EL device receives attention as a light emitting device. The organic EL device is a self-emissive device in which an organic layer including a light emitting layer, disposed between an anode electrode and a cathode electrode, emits light when holes and electrons, generated when voltages are supplied to the anode and cathode electrodes, are combined.

In the organic EL element, a technique is proposed which makes a characteristic of each of R, G and B pixels become uniform when an image is displayed using pixels emitting red (R), green (G) and blue (B), e.g., in which a thickness of an organic layer of a red pixel increases, thus increasing the fabrication cost and the driving voltage.

SUMMARY

One or more embodiments is directed to provide an organic EL device which includes a red light emitting area including a first electrode having a light transmitting characteristic and an organic layer, the first electrode and the organic layer being stacked; a green light emitting area including a first electrode having a light transmitting characteristic and an organic layer, the first electrode and the organic layer being stacked; and a second electrode disposed on the organic layer of the red light emitting area and on the organic layer of the green light emitting area and having a light reflecting characteristic. Reflectance of green light, e.g., having a wavelength of 550 nm, by the second electrode of the red light emitting area is smaller than reflectance of green light by the second electrode of the green light emitting area. Reflectance of red light, e.g., having a wavelength of 620 nm, by the second electrode of the red light emitting area is larger than reflectance of red light by the second electrode of the green light emitting area.

The second electrode of the red light emitting area may include a layer including copper and formed on the organic layer of the red light emitting area.

A thickness of the layer including the copper may be between 5 nm and 50 nm and the second electrode of the red light emitting area may be formed on the layer including the copper and of a material including aluminum or silver.

The second electrode of the red light emitting area may have a layer including gold. The second electrode of the red light emitting area may be formed on the layer including gold and of a material including aluminum or silver.

The organic layers of the red and green light emitting areas may be used in common except for a light emitting layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
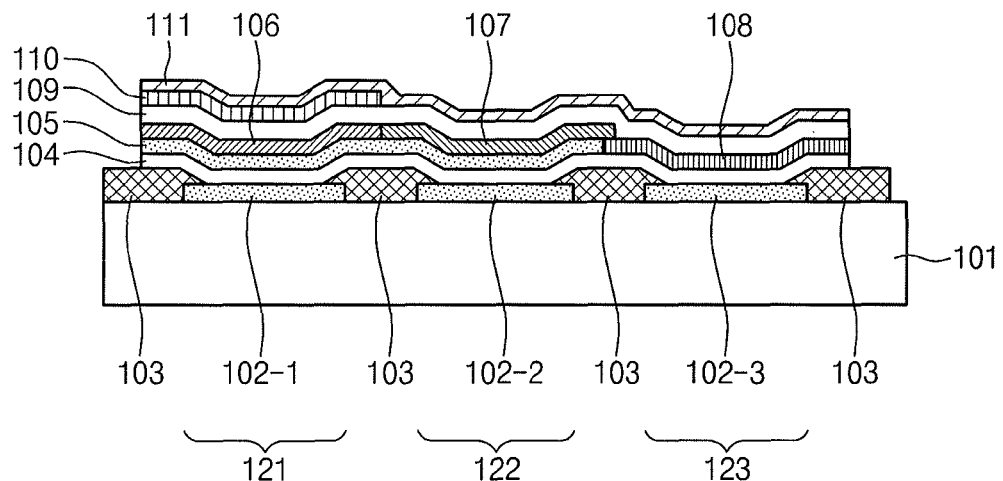
FIG. 1 illustrates a cross-sectional view of an organic EL device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 illustrates a cross-sectional view of an organic EL device according to an embodiment. In FIG. 1, a device is formed on a substrate 101 having pixel areas 121, 122, and 123. Below, it is assumed that a device emitting red is formed at the pixel area 121, a device emitting green is formed at the pixel area 122, and a device emitting blue is formed at the pixel area 123. The pixel area 121 is referred to as a red emitting device, the pixel area 122 is referred to as a green emitting device, and the pixel area 123 is referred to as a blue emitting device.

An arrangement order of pixel areas 121 to 123 is arbitrary. As illustrated in FIG. 1, the pixel area 121 generating red may be adjacent to the pixel area 122 generating green, allowing an organic layer excluding a light emitting layer to be formed the same at the pixel area 121 generating red and the pixel area 122 generating green. In the organic EL device according to an embodiment, the pixel area 123 generating blue be omitted. That is, only the pixel area 121 generating red and the pixel area 122 generating green may exist.

A substrate having an insulation characteristic, e.g., plastic, quartz, etc., may be used as the substrate 101. Since a bottom emission type of organic EL device is mainly described as an embodiment, the substrate 101 may be formed by a transparent material.

First electrodes 102-1, 102-2, and 102-3 are formed on the substrate 101 to correspond to respective light emitting areas. In case of a bottom emission type of organic EL device according to an embodiment, the first electrodes 102-1, 102-2, and 102-3 may be formed of a transparent conductive material. For example, the first electrodes 102-1, 102-2, and 102-3 may be formed of ITO, IZO, and so forth.

A pixel defining layer 103 for pixel isolation may be formed on the substrate 101. The first electrodes 102-1, 102-2, and 102-3 are separated by the pixel defining layer 103, and a range of the pixel areas 121, 122, and 123 are defined by the pixel defining layer 103. An organic insulation layer is used as the pixel defined layer 103. The organic insulation layer may be formed of, e.g., an acrylic resin.

An organic layer may be formed on the first electrodes 102-1, 102-2, and 102-3 and the pixel defined layer 103. In detail, a first hole transfer layer 104 may be formed on the first electrodes 102-1, 102-2, and 102-3. The first hole transfer layer 104 injects holes in portions, corresponding to the pixel areas 121, 122, and 123, of the organic layer formed on the first hole transfer layer 104 according to voltages applied to the first electrodes 102-1, 102-2, and 102-3. For example, the first hole transfer layer 104 may be formed of NPB (Naphthyl.Phenyl.Benzene). In exemplary embodiments, as illustrated in FIG. 1, the first hole transfer layer 104 may be formed in common at the pixel areas 121, 122, and 123.

In exemplary embodiments, a second hole transfer layer 105 may be formed on a portion, corresponding to the pixel areas 121 and 122, of the first hole transfer layer 104. Also, a blue light emitting layer 108 is formed on a portion, corresponding to the pixel area 123, of the first hole transfer layer 104. A material of the second hole transfer layer 105 may be the same as or different from that of the first hole transfer layer 104. Thus, a material of a hole transfer layer may be thickly stacked on the portion corresponding to the pixel areas 121 and 122 according to a thickness of the second hole transfer layer 108, as compared with the portion corresponding to the pixel area 123. A layer thickness may be suitable for a light extraction condition for an organic EL device according to an embodiment to have a light resonator structure.

A red light emitting layer 106 is formed on a portion, corresponding to the pixel area 121, of the hole transfer layer 105, and a green light emitting layer 107 is formed on a portion, corresponding to the pixel area 122, of the hole transfer layer 105.

An electron transfer layer 109 is formed on the red light emitting layer 106, the green light emitting layer 107 and the blue light emitting layer 108. The electron transfer layer 109 supplies the red light emitting layer 106, the green light emitting layer 107 and the blue light emitting layer 108 with electrons supplied from a second electrode to be described later. For example, the electron transfer layer 109 may be formed of a material such as BCP (bathocuproine). In exemplary embodiments, as illustrated in FIG. 1, the electron transfer layer 109 may be formed in common at the pixel areas 121, 122, and 123.

As described above, each of the red light emitting area and the green light emitting area according to an embodiment, in common, has such a structure that a first electrode having a light transmitting characteristic, an organic layer formed on the first electrode, and a second electrode having a light reflecting characteristic are stacked. In particular, hole and electron transfer layers of the organic layer are formed using the same material, and a process of forming the organic layer is simplified.

A second electrode 111 may be disposed on the electron transfer layer 109 to be formed in common at the pixel areas 121, 122, and 123. In case of a bottom emission type of organic EL device according to an embodiment, the second electrode 111 may be formed of a material having a light reflecting characteristic. For example, the second electrode 111 may be formed of a metallic material. In detail, the second electrode 111 may be formed of aluminum (Al).

In exemplary embodiments, a layer 110 is formed on a port, corresponding to the pixel area 121, of the electron transfer layer 109 using a material having a reflecting characteristic and different from a material of the second electrode 111. The layer 110 may be formed of a material of improving reflectance of red light in combination with a material having a reflecting characteristic of the second electrode 111.

In particular, to improve reflectance of red light, e.g., light having a wavelength of 620 nm, red reflectance from the layer 110 and the second electrode 111 combined may be larger than that from the second electrode 111 alone. Further, reflectance of light having a wavelength of 550 nm from the layer 110 and the second electrode 111 combined may be smaller than that from the second electrode 111 alone.

Figure 2:
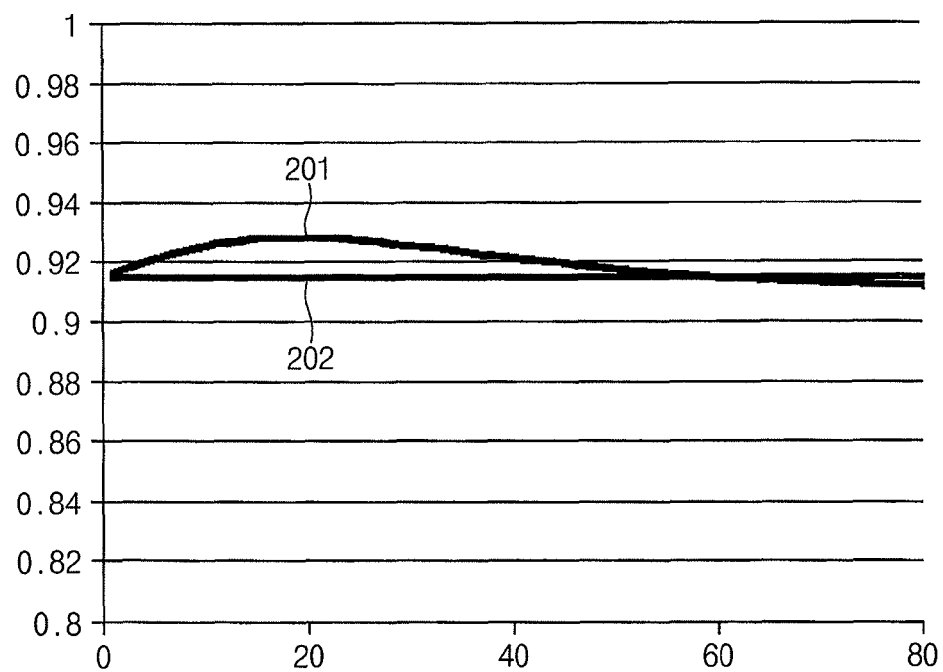
FIG. 2 illustrates a graph showing a relation between a thickness of a copper layer and reflectance of light having a wavelength of 620 nm.

FIG. 2 illustrates a result of measurement on reflectance of light having a wavelength of 620 nm when an aluminum layer and a copper layer are combined and in a case where only an aluminum layer is used. In FIG. 2, the horizontal axis is reflectance and the vertical axis is the thickness of the copper layer in nanometers.

A reference numeral 201 shows a result of measurement on reflectance of light when a copper layer is formed on one surface of an aluminum layer and light having a wavelength of 620 nm is provided to the copper layer side. In this case, a thickness of the aluminum layer is about 120 nm and reflects most visible light. A thickness of the copper layer is varied from 5 nm to 50 nm.

A reference numeral 202 shows a result of measurement on reflectance of light having a wavelength of 620 nm in the event that an aluminum layer is only used. In this case, a thickness of the aluminum layer is about 120 nm that reflects most visible light. Since no copper layer exists, reflectance does not follow a thickness of the copper layer of a horizontal axis. That is, the reflectance has a constant value.

In general, reflectance of copper is larger than that of aluminum in a domain of light the wavelength of which is more than 630 nm, and reflectance is reduced in a green and red light domain. Since an emission peak wavelength of a red light emitting layer is around 620 nm, it is difficult to improve reflectance of red only using a copper layer.

As illustrated in FIG. 2, however, if a thickness of a copper layer is between 5 nm and 50 nm, reflectance of light having a wavelength of 620 nm in a case where an aluminum layer and a copper layer are combined is improved as compared with the case when the aluminum layer is only used. In particular, in the event that a thickness of the copper layer is 30 nm, reflectance is improved by 12% as compared with the case when the aluminum layer is only used.

Figure 3:
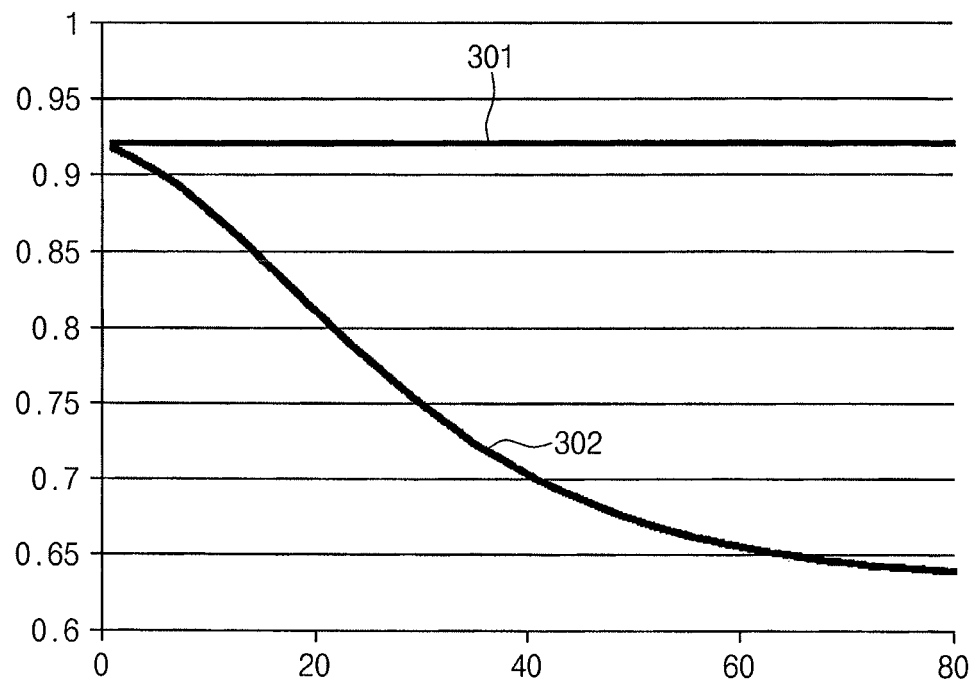
FIG. 3 illustrates a graph showing a relation between a thickness of a copper layer and reflectance of light having a wavelength of 550 nm.

FIG. 3 illustrates a result of measurement on reflectance of light having a wavelength of 550 nm in a case where an aluminum layer and a copper layer are combined and in a case where an aluminum layer is only used. In FIG. 3, the horizontal axis is reflectance and the vertical axis is the thickness of the copper layer in nanometers.

A reference numeral 302 shows a result of measurement on reflectance of light in the event that a copper layer is formed on one surface of an aluminum layer and a light having a wavelength of 550 nm is incident on a copper layer side. A reference numeral 301 shows a result of measurement on reflectance of light having a wavelength of 550 nm in the event that an aluminum layer is only used. Each of the aluminum layer and the copper layer has the same thickness as described with reference to FIG. 2.

It is understood from FIG. 3 that reflectance of light having a wavelength of 550 nm is reduced in proportion to an increase in thickness of copper.

Here, in the event that the second electrode 111 according to an embodiment of includes a material such as aluminum (Al), a copper layer 110 is formed on an electron transfer layer 109 that is formed on a red light emitting layer 106. Also, the copper layer 110 is not formed on the electron transfer layer 109 that is formed on a green light emitting layer 107 and a blue light emitting layer 108.

The second electrode 111 may be formed to have a thickness of 120 nm that reflects most visible light and a thickness of the copper layer 110 may be between 5 nm and 50 nm. If the thickness of the copper layer 110 is less than 5 nm, reflectance of the copper layer 110 is insufficient and an effect obtained by using the copper layer 110 is reduced. In practice, in the event that the thickness of the copper layer 110 is less than 5 nm, brightness is reduced although an x value of CIE1931(x, y) chromaticity is decreased, in comparison with the case that the thickness of the copper layer 110 is 10 nm.

If the thickness of the copper layer 110 exceeds 50 nm, reflectance of light having a wavelength of 620 nm is reduced in comparison with that of aluminum alone. Also, having a thinner copper layer 110 reduces time taken to form the copper layer 110 on the electron transfer layer 109 formed on a red light emitting layer 106, the amount of material used, and maintenance of a layer forming apparatus.

Alternatively, silver (Ag) may be used as a material of the second electrode 111 and copper (Cu) may be used as a material of the layer 110. As another alternative, aluminum (Al) may be used as a material of the second electrode 111 and gold (Au) may be used as a material of the layer 110. As yet another alternative, silver (Ag) may be used as a material of the second electrode 111 and gold (Au) may be used as a material of the layer 110. Also, alloy of different metals may be used as the second electrode 111 and the layer 110 to prevent generation of migration or defect.

A bottom emission type of organic EL device according to an embodiment has been described above. However, embodiments are applicable to a top emission type of organic EL device.

(Measurement)

Below, a result of measuring light emitting efficiency of an organic EL device according to an embodiment and a result of measuring light emitting efficiency of an organic EL device according to the prior art are described.

The following table 1 shows light emitting brightness, CIE1931(x, y) chromaticity, a driving voltage having a current density of 10 mA/cm$^2$, and a driving voltage having a current density of 100 mA/cm$^2$ when a quartz substrate is used as a substrate 101, an ITO layer having a thickness of 70 nm is used as first electrodes 102-1, 102-2, and 102-3, an NPB layer having a thickness of 155 nm is used as a first hole transfer layer 104, an NPB layer having a thickness of 85 nm is used as a second hole transfer layer 105, a red light emitting layer 106 has a layer thickness of 40 nm, a green light emitting layer 107 has a thickness of 20 nm, a blue light emitting layer 108 has a layer thickness of 20 nm, a BCP layer having a thickness of 30 nm, an LiF layer having a thickness of 1 nm are used as an electron transfer layer 109, and an aluminum layer having a thickness of 120 nm is used as a second electrode 111. A thickness of a copper layer used as a layer 110 is sequentially changed from 0 nm (i.e., the case that the layer 110 does not exist) to 5 nm, 10 nm, 20 nm, 30 nm, 50 nm, and 100 nm. In the table 1, a blank of the driving voltage means that the driving voltage is not measured.

TABLE 1

| Thickness of Cu layer (nm) | Emission brightness (cd m$^{-2}$) | CIE1931(x, y) chromaticity | Driving voltage (V) having a current density of 10 mA/cm$^2$ | Driving voltage (V) having a current density of 100 mA/cm$^2$ |
|---|---|---|---|---|
| 0 | 1.2200e+003 | (6.5971e−001, 3.4000e−001) | 4.9 | |
| 5 | 1.2771e+003 | (6.6050e−001, 3.3921e−001) | 5.1 | |
| 10 | 1.3128e+003 | (6.6140e−001, 3.3832e−001) | 5.0 | |
| 20 | 1.3387e+003 | (6.6311e−001, 3.3662e−001) | 5.0 | |
| 30 | 1.3352e+003 | (6.6440e−001, 3.3533e−001) | 5.0 | 8.5 |
| 50 | 1.3147e+003 | (6.6580e−001, 3.3394e−001) | 5.0 | |
| 100 | 1.2970e+003 | (6.6651e−001, 3.3323e−001) | 5.0 | |

Figure 4:
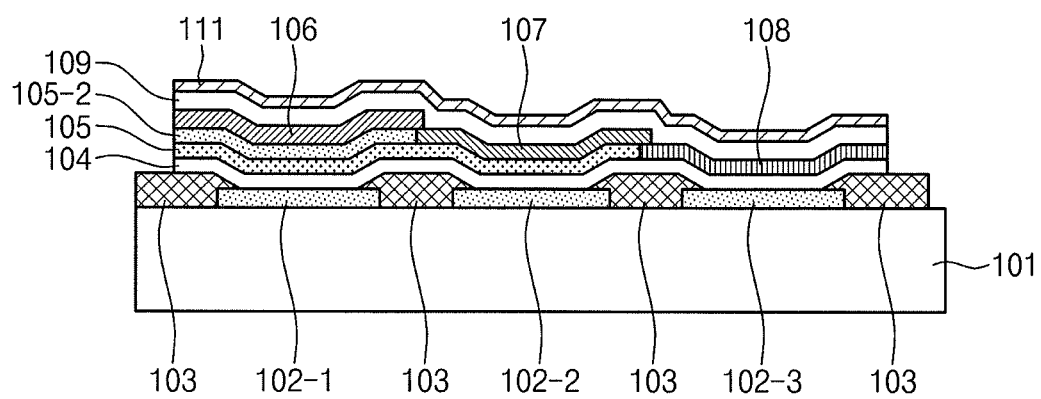
FIG. 4 illustrates a cross-sectional view of an organic EL device according to a comparative example.

Like table 1, the following table 2 shows light emitting brightness, CIE1931(x, y) chromaticity, a driving voltage having a current density of 10 mA/cm$^2$ and a driving voltage having a current density of 100 mA/cm$^2$ with respect to an organic EL device according to a comparative example shown in FIG. 4.

FIG. 4 illustrates different from FIG. 1 in that a hole transfer layer 105-2 is further formed under a red light emitting layer 106. Also, in FIG. 4, the hole transfer layer 105-2 has a thickness of 40 nm. Also, in FIG. 4, a layer 110 is not used.

TABLE 2

| Light emitting brightness (cd m−2) | chromaticity | Driving voltage (V) having a current density of 10 mA/cm$^2$ | Driving voltage (V) having a current density of 100 mA/cm$^2$ |
|---|---|---|---|
| 1.2637e+003 | (6.7128e−001, 3.2849e−001) | 5.8 | 10.3 |

Referring to the tables 1 and 2, when a thickness of a copper layer is between 5 nm and 50 nm, in particular, when a thickness of a copper layer is between 20 nm and 30 nm, brightness of an organic EL device according to an embodiment is higher than that of an organic EL device according to the comparative example. Also, in an organic EL device according to an embodiment, a driving voltage for the same current density is reduced by 0.8V. The reason is that a thickness of an organic layer is thinner than that of an organic EL device according to the comparative example.

Improvement of resolution and display brightness of a display device using an organic EL device is required, and a current density of 100 mA/cm$^2$ need be considered as a peak value. Under this situation, a driving voltage is lowered from 10.3V to 8.5V, that is, by 1.8V. Thus, it is possible to implement a low-power and long-life display device.

By way of summation and review, according to embodiments, an organic EL device includes a second electrode that efficiently reflects light generated by an organic layer of the red light emitting area, improving light extraction efficiency. Also, a thickness of the organic layer of the red light emitting area may be reduced as compared with that according to the conventional art, allowing a decrease in a driving voltage and fabrication cost.

Additionally, for example, when the red light emitting area includes a layer formed of a material including copper having a thickness between 5 nm and 50 nm, red light extraction efficiency may be further improved as compared with the case that a layer formed of a material including aluminum or silver is only used.

Further, the organic layers of the red and green light emitting areas may be used in common except for a light emitting layer. In this case, a process of forming an organic layer is simplified, and an increase in a fabrication cost of an organic EL device is suppressed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic EL device comprising:
   a red light emitting area including a first red electrode having a light transmitting characteristic, an organic layer, and a reflector having a first light reflecting characteristic, the first red electrode, the organic layer, and the reflector being stacked;
   a green light emitting area including a first green electrode having a light transmitting characteristic and an organic layer and excluding the reflector, the first green electrode and the organic layer being stacked; and
   a second electrode on the organic layer of the red light emitting area and on the organic layer of the green light emitting area, the second electrode having a second light reflecting characteristic, wherein the reflector includes a material and thickness to cause:
   reflectance of green light produced by a combination of the first light reflecting characteristic of the reflector and the second light reflecting characteristic of the second electrode in the red light emitting area to be smaller than reflectance of green light by the second electrode in the red light emitting area taken alone; and
   reflectance of red light produced by a combination of the first light reflecting characteristic of the reflector and the second light reflecting characteristic of the second electrode in the red light emitting area is larger than reflectance of red light by the second electrode in the red light emitting area taken alone.

2. The organic EL device as claimed in claim 1, wherein the reflector in the red light emitting area comprises a layer including copper.

3. The organic EL device as claimed in claim 2, wherein
   a thickness of the layer including the copper is between 5 nm and 50 nm and
   the second electrode of the red light emitting area is formed on the layer including copper and of a material including aluminum or silver.

4. The organic EL device as claimed in claim 3, wherein the organic layer of the red light emitting area and the organic layer of the green light emitting area have one or more common layers except for a light emitting layer.

5. The organic EL device as claimed in claim 1, wherein a red reflectance in the red light emitting area is centered on light having a wavelength of 620 nm.

6. The organic EL device as claimed in claim 5, wherein green reflectance in the red light emitting area is centered on light having a wavelength of 550 nm.

7. The organic EL device as claimed in claim 1, wherein the reflector comprises a layer including gold.

8. The organic EL device as claimed in claim 7, wherein the second electrode of the red light emitting area is formed on the layer including gold and of a material including aluminum or silver.

9. The organic EL device as claimed in claim 8, wherein the organic layer of the red light emitting area and the organic layer of the green light emitting area have one or more common layers except for a light emitting layer.

* * * * *